(12) United States Patent
Pavinski, Jr. et al.

(10) Patent No.: US 8,389,978 B2
(45) Date of Patent: Mar. 5, 2013

(54) TWO-SHELF INTERCONNECT

(75) Inventors: Donald J. Pavinski, Jr., West Pittston, PA (US); Renshan Zhang, Sunnyvale, CA (US); Jiaming Zhang, Macungie, PA (US); James Stewart, San Mateo, CA (US); Jie Tang, Fogelsville, PA (US)

(73) Assignee: Infinera Corporation, Sunnyvale, CA (US)

( * ) Notice: Subject to any disclaimer, the term of this patent is extended or adjusted under 35 U.S.C. 154(b) by 569 days.

(21) Appl. No.: 12/709,768

(22) Filed: Feb. 22, 2010

(65) Prior Publication Data
US 2011/0204507 A1 Aug. 25, 2011

(51) Int. Cl.
*H01L 29/06* (2006.01)
(52) U.S. Cl. ............... 257/29; 257/13; 257/17; 257/21; 257/79; 257/228
(58) Field of Classification Search .................. None
See application file for complete search history.

(56) References Cited

U.S. PATENT DOCUMENTS 5,962,926 A * 10/1999 Torres et al. ............... 257/786

* cited by examiner

*Primary Examiner* — Kyoung Lee
(74) *Attorney, Agent, or Firm* — David L. Soltz (57) ABSTRACT

Consistent with the present disclosure, a package is provided that includes a housing having a recessed portion to accommodate an integrated circuit or chip. The housing has an inner periphery that defines or delineates the recessed portion. The inner periphery may be stepped and includes first and second surfaces that are spaced vertically from one another and extend in respective parallel planes, for example, to thereby constitute first and second shelves. First bonding pads or contacts ("housing pads") may be provided on the first surface, which may electrically connect or interconnect with first pads on the integrated circuit ("IC pads"), and second housing pads may be provided on the second surface, which can electrically connect or interconnect with second IC pads. Thus, the IC pads connect to corresponding housing pads on the inner periphery of the housing that are above and below one another. Since the housing pads are not provided on the same surface, the number of housing pads on each step or shelf of the periphery can be reduced, and the housing pads can be spaced from one another by a spacing or pitch that is greater than that of the IC pads. Accordingly, the dimensions and spacing of the housing pads may comply with relevant design rules, while providing connection to an increased number of IC pads.

21 Claims, 6 Drawing Sheets

TWO-SHELF INTERCONNECT

BACKGROUND

Chip packages are known which house integrated circuits provided on a semiconductor die. The chip package may include traces or other conductors that provide an electrical connection, via bonding wires, for example, to corresponding bonding pads in an integrated circuit. The bonding pads, in turn, input or output electrical signals to or from various devices in the integrated circuit. With improved processing and lithographic techniques, integrated circuit density has increased, and the dimensions of electrical contacts, such as the bonding pads, as well other integrated circuit components, have been reduced. Accordingly, more devices and a corresponding increased number of bonding pads, has been incorporated into integrated circuits.

Chip packages having an increased number of traces or conductors, therefore, are therefore provided in order to provide a sufficient number of electrical connections to such higher density integrated circuits. Typically, however, fabrication design rules require that the traces be spaced from one another by a predetermined distance. Accordingly, larger chip packages may be required to accommodate a larger number of traces. As a result, fewer such larger chip packages may be provided on a printed circuit board (PCB), thereby requiring more PCBs and increasing system cost.

Thus, a chip package is needed that has a relatively small size and can accommodate and provide electrical connections to higher density integrated circuits.

SUMMARY

Consistent with an aspect of the present disclosure, a package is provided that comprises a housing that includes a package. The package has a housing including a portion configured to receive an integrated circuit. The integrated circuit includes a plurality of electrical contacts, adjacent ones of which are separated from one another by a first pitch. The housing also has a first surface that extends in a first plane and a second surface that extends in a second plane that is parallel to the first plane. The first surface is separated from the plurality of electrical contacts by a first distance and the second surface being separated from the plurality of electrical contacts by a second distance that is greater than the first distance. In addition, a first plurality of conductors are provided on the first surface, adjacent ones of the first plurality of conductors being separated from one another by a second pitch that is greater than the first pitch. Each of the first plurality of conductors is configured to be electrically connected to a corresponding one of each of a first group of the plurality of electrical contacts. Further, a second plurality of conductors is provided on the second surface, adjacent ones of which are separated from one another by a third pitch that is greater than the first pitch. Each of the second plurality of conductors is configured to be electrically connected to a corresponding one of each of a second group of the plurality of electrical contacts.

It is to be understood that both the foregoing general description and the following detailed description are exemplary and explanatory only and are not restrictive of the invention, as claimed.

The accompanying drawings, which are incorporated in and constitute a part of this specification, illustrate various embodiments and together with the description, serve to explain aspects of the disclosure.

DESCRIPTION OF THE EMBODIMENTS

Consistent with the present disclosure, a package is provided that includes a housing having a recessed portion to accommodate an integrated circuit or chip. The housing has an inner periphery that defines or delineates the recessed portion. The inner periphery may be stepped and includes first and second surfaces that are spaced vertically from one another and extend in respective parallel planes, for example, to thereby constitute first and second shelves. First bonding pads or contacts ("housing pads") may be provided on the first surface, which may electrically connect or interconnect with first pads on the integrated circuit ("IC pads"), and second housing pads may be provided on the second surface, which can electrically connect or interconnect with second IC pads. Thus, the IC pads connect to corresponding housing pads on the inner periphery of the housing that are above and below one another. Since the housing pads are not provided on the same surface, the number of housing pads on each step or shelf of the periphery can be reduced, and the housing pads can be spaced from one another by a spacing or pitch that is greater than that of the IC pads. Accordingly, the dimensions and spacing of the housing pads may comply with relevant design rules, while providing connection to an increased number of IC pads.

Reference will now be made in detail to the present embodiments, examples of which are illustrated in the accompanying drawings. Wherever possible, the same reference numbers will be used throughout the drawings to refer to the same or like parts.

Figure 1:
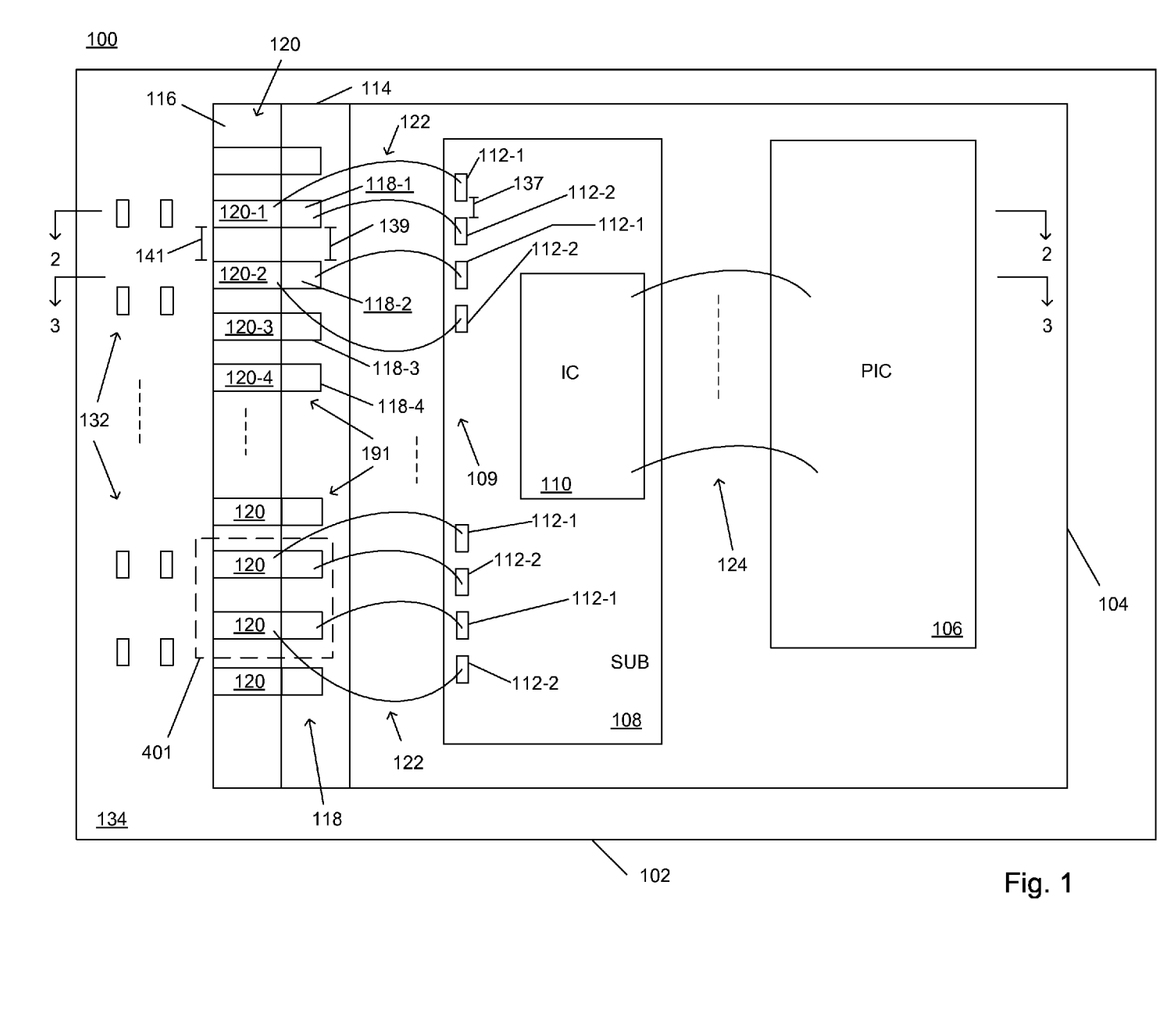
FIG. 1 is a plan view of a package consistent with an aspect of the present disclosure.

FIG. 1 illustrates a package 100 consistent with an aspect of the present disclosure. Package 100 includes a housing 102 having a recessed portion 104 configured to accommodate, for example, substrate 108 and photonic integrated circuit (PIC)106. An application specific integrated circuit (ASIC) 110, for example, may be provided on substrate 108. A plurality of electrical contacts or conductive contacts, such as pads 112-1 and 112-2, may be provided along edge 109 of substrate 108. Pads 112-1 and 112-2 may be electrically connected to ASIC 110 via traces (not shown) and may be separated from one another by a first pitch or spacing 137, which may be, for example, 100 microns. Pads 112-1 and 112-2 may be collectively referred to herein as pads 112.

As further shown in FIG. 1, each of pads 112-1 is electrically connected to a corresponding one of conductors or traces 120 and each of pads 112-2 are connected to a corresponding one of conductors or traces 118. Such electrical connections are made via additional conductors, such as wires 122. Traces 118 (two of which are traces 118-1 and 118-2) are provided on a first shelf or surface 114 and traces 120 are provided on a second shelf or surface 116. Surfaces 114 and 116 are preferably provided along inner periphery 191 of housing 102.

Traces 118 are separated from one another by spacing or pitch 139, and traces 120 are separated from one another by spacing or pitch 141. Preferably, pitch 139 and pitch 141 are the same or substantially the same and may be equal to or substantially equal to 200 microns. In addition, pitch 139, as well as pitch 141, is greater than pitch 137, which, as noted above, is the spacing between adjacent ones of pads 112, e.g., the spacing between one of pads 112-1 and one of pads 112-2 immediately adjacent to it. Pitch 137 between adjacent ones of pads 112 may be equal to or substantially equal to 100 microns, for example.

As discussed in greater detail below with respect to FIGS. 2 and 3, traces 118 and 120 extend into housing 102 and are connected to pads 132 provided on a top surface 132 of housing 102. Namely, FIGS. 2 and 3 illustrate cross-sectional views of housing 120 taken along lines 2 and 3, respectively, in FIG. 1.

Figure 2:
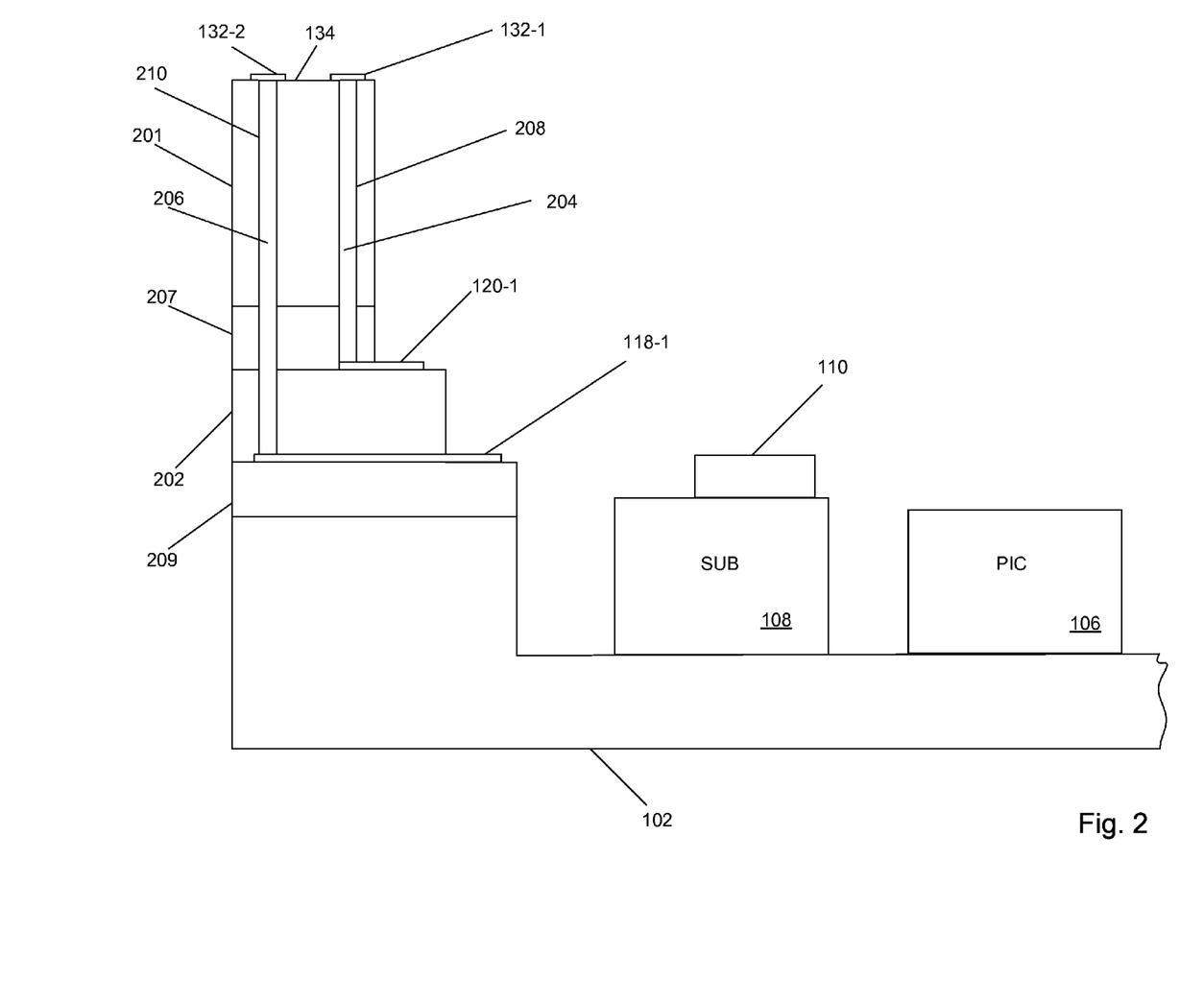
FIG. 2 illustrates a first cross-sectional taken along line 2-2 in FIG. 1.

As shown in FIG. 2, housing 102 may include insulative layers 201, 202, 207, and 209, as well as other insulative layers (not shown). Trace 118-1, extends between insulative layers 202 and 209 of housing 102. A channel or via 210 may be provided in housing 102 that extends through layers 201, 207, and 202. Via 210 may be filled with a known metal or alloy, such as conductor 206, to provide an electrical connection to trace 118-1. In addition, channel or via 208 may extend through different portions of layers 201 and 207 than via 210 to trace 120-1 (one of traces 120 in FIG. 1). Channel or via 208 is also filled with a conductor 204, which may include a know metal or alloy. Conductors 204 and 206 preferably contact corresponding ones of pads 132, namely, pads 132-1 and 132-2, respectively, such that external connections may be made to traces 118-1 and 120-1. Pads 132-1 and 132-2 are provided on surface 134 of housing 102.

Figure 3:
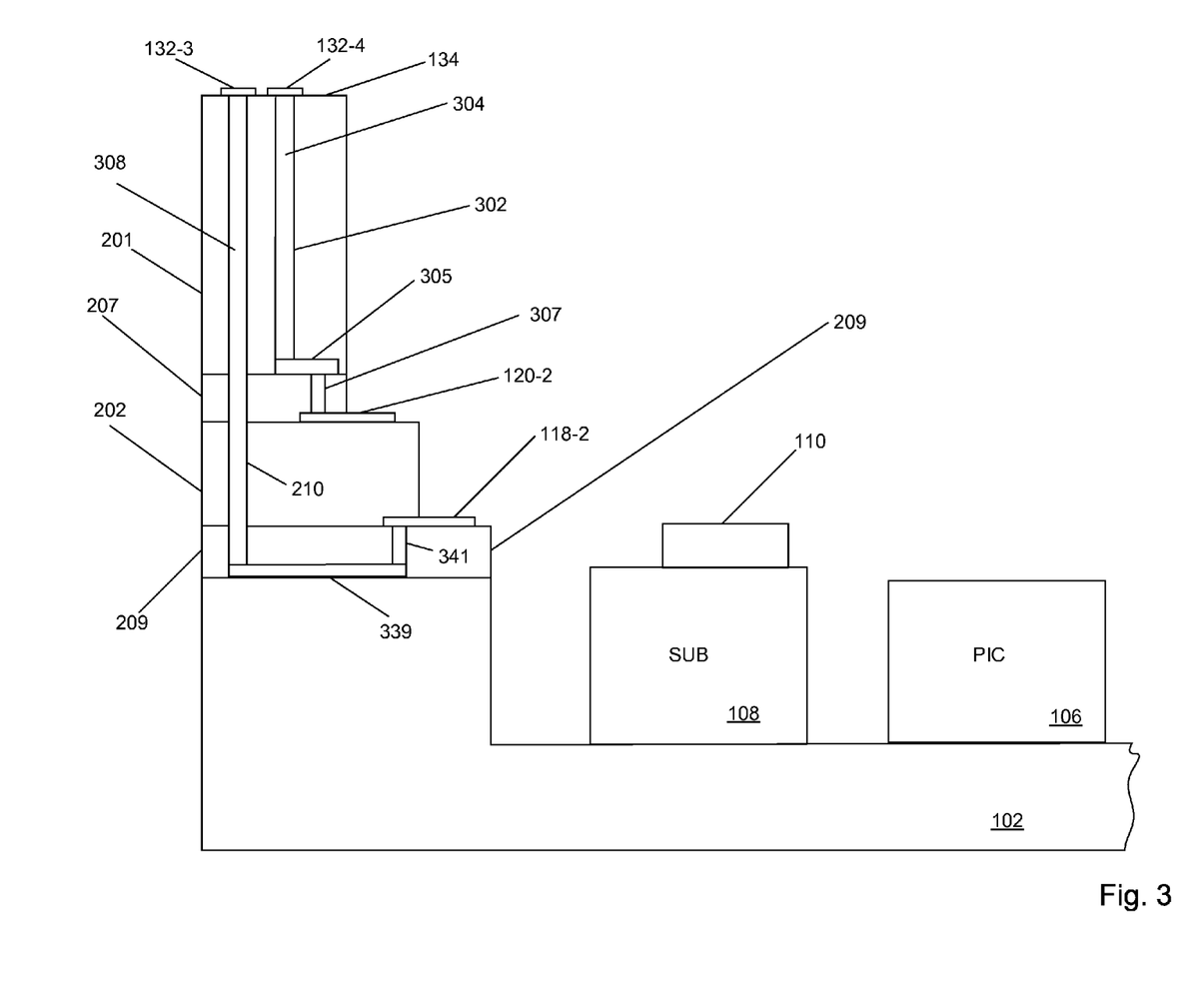
FIG. 3 illustrates a second cross-sectional view taken along line 3-3 in FIG. 1.

In FIG. 3, trace 118-2 is provided on insulating layer 209 and extends to conductive portion 341, which provides a connection to lateral conductor or conductive portion 339. Via 210 extends through layers 201, 202, 207, and 209 and is filled with conductor 308 to provide an electrical connection between pad 132-3 (one of pads 132 shown in FIG. 1) and trace 118-2 through portions 341, 339, and 308. In addition, trace 120-2 (one of traces 120 shown in FIG. 1) is connected with pad 132-4 through conductor or conductive portion 304 (provided in via 302), conductive portion 305, and conductive portion 307. Each of conductive portions 304, 305, and 307, 308, 339, and 341 preferably includes a known conductor, such as a metal or alloy that can provide an adequate electrical connection between pad 132-3 and trace 118-2, as well as As further shown in FIGS. 2 and 3, traces 120-1 and 120-2 overlap traces 118-1 and 118-2, respectively, and are separated from each other by insulating layer 202.

Figure 4:
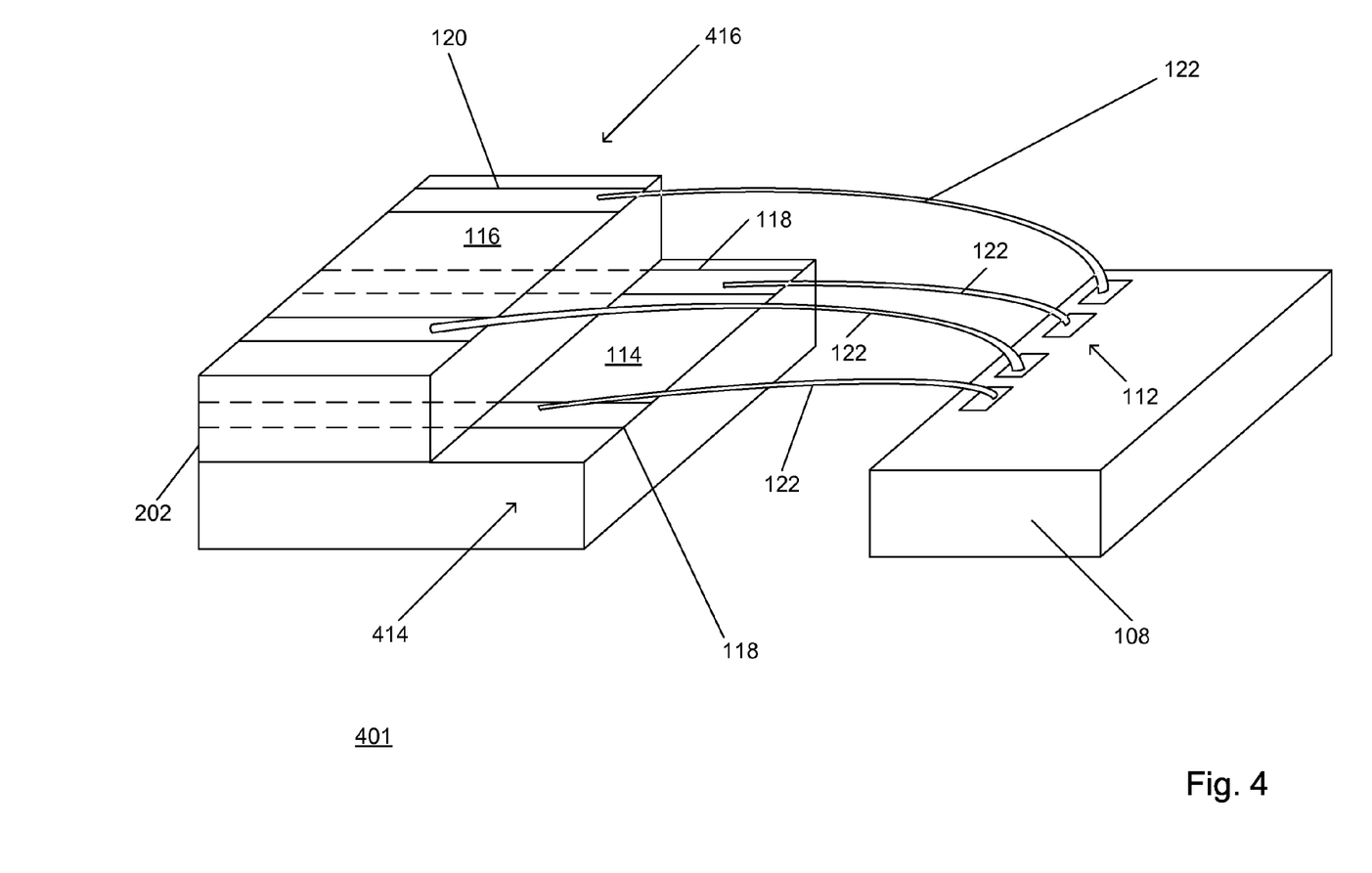
FIG. 4 illustrates a perspective view of a portion of the package shown in FIG. 1.

FIG. 4 illustrates a perspective view of portion 401 of housing 102. Portion 401 includes traces 118 provided on shelf or surface 114 and traces 120 are provided on shelf or surface 116. As further shown in FIG. 4, surface 116 extends in plane 416 and surface 114 extends in plane 414, which is spaced from and preferably parallel to, the plane 416. Typically, traces 118 are spaced from pads 112 from a distance, which is less than the distance separating traces 120 from pads 112.

In operation, trace 118-1 shown in FIGS. 1-3 may carry a signal and trace 118-2 may carry the complement of that signal, such that, collectively, traces 118-1 and 118-2 supply differential signals to ASIC 110. ASIC 110, in turn, may generate, for example, appropriate drive signals based on such differential signals. The drive signals are then supplied to PIC 106. PIC 106 includes optical modulators, such as those described in U.S. Patent Publication No. 20090245795, the entire contents of which are incorporated herein by reference. The optical modulators in PIC 106 may supply modulated optical signals in response to the drive signals.

In addition, traces 120-1 and 120-2 may be grounded, so that ASIC 110 and/or PIC 106 may be appropriately biased. As noted above, traces 120-1 and 120-2 overlap traces 118-1 and 118-2, respectively and are provided on a shelf or surface 116, while traces 118-1 and 118-2 are provided on shelf or surface 114.

Preferably, alternating pairs of traces 118 and traces 120 carry differential signals and a ground potential, such that, as noted above, traces 120-1 and 120-2 are grounded, and traces 120-3 and 120-4 carry differential signals (see FIG. 1). In addition, traces 118-1 and 118-2 carry differential signals, and traces 118-3 and 118-4 are grounded. Typically, the grounded pairs of traces 120 overlap or overly pairs of traces 118 that carry differential signals. In addition, grounded pairs of traces 118 overlap or underlie pairs of traces 120 that carry differential signals may be provided in order to minimize space and for convenience. Thus, grounded traces are provided on opposite sides of differential signal carrying traces. Moreover, as noted above, since traces 118 and 210 are provided on different shelves (e.g., surfaces 114 and 116) within housing 102, the size of housing 102 may be reduced, even though each trace may be spaced from one another at a greater pitch than the pads (e.g., pads 112) on substrate 108.

Figure 5:
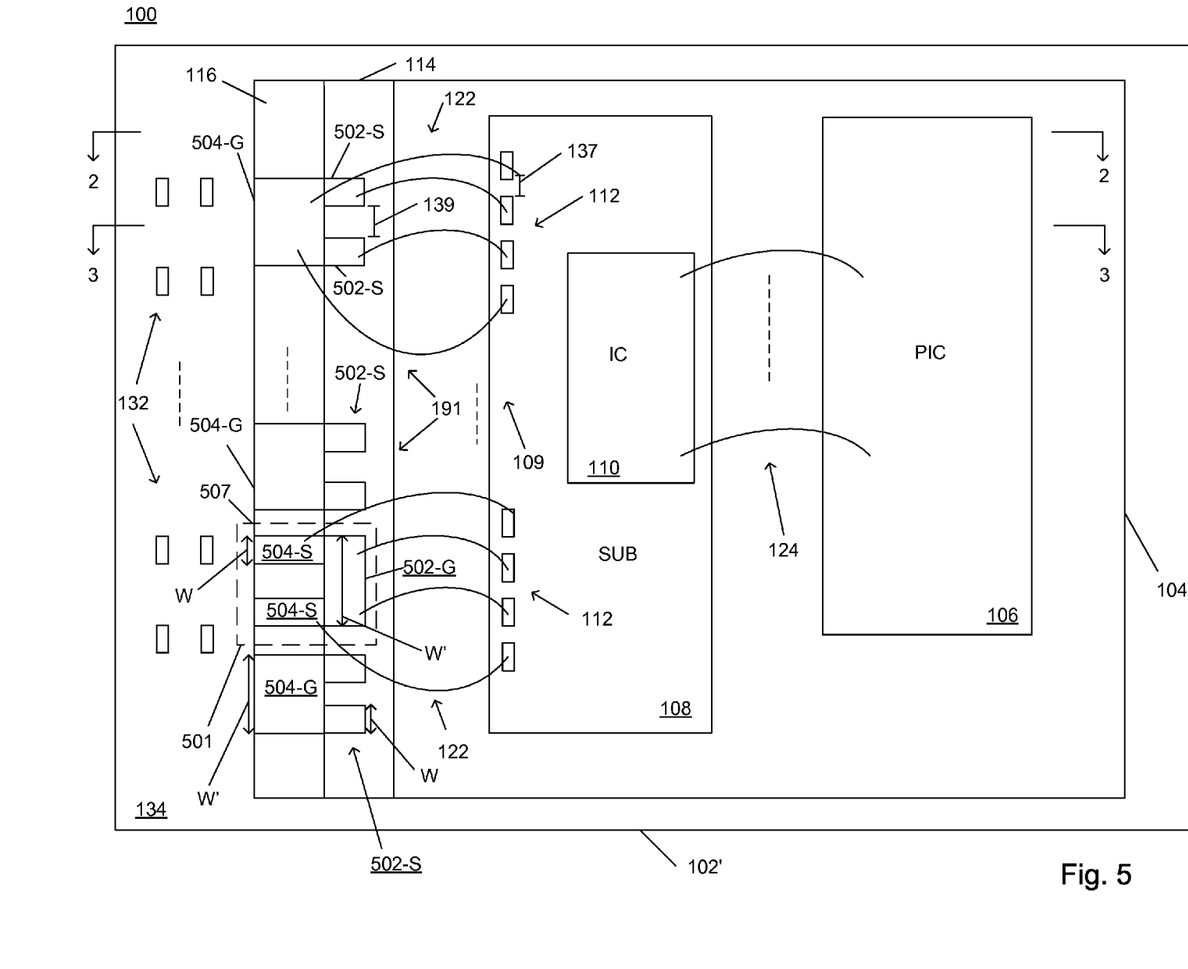
FIG. 5 illustrates a plan view of a package consistent with an additional aspect of the present disclosure.

FIG. 5 illustrates a plan view of a housing 102' consistent with an alternative embodiment of the present disclosure. Housing 102' is similar to housing 102 discussed above, except the structure or geometry of the grounded traces in housing 102' (e.g., traces 502-G and 504-G) is different than that of the pairs of grounded ones of traces 118 and 120 discussed above. Namely, since the pairs of grounded ones of traces 118 and 120 are maintained at the same potential, one grounded conductor may be provided, instead of two. Accordingly, each grounded pair of traces 118 and 120 may be replaced with a corresponding one of traces 502-G and 504-G, thereby simplifying the layout of such traces.

For example, as further shown in FIG. 5, relatively large grounded traces, i.e., traces having a relatively large surface, are provided, e.g., 504-G and 502-G, and pairs of wires 122 connect each such grounded trace to corresponding ones of pads 112 on substrate 108. Thus, one grounded trace, e.g., 502-G, may be connected to a corresponding pair of pads 112. Likewise, one grounded trace, e.g., 504-G, may be connected to another corresponding pair of pads 112. Moreover, along each shelf 114 and 116, pairs of differential signal carrying traces (e.g., 502-S and 504-S) are provided between each grounded trace 502-G and 504-G (traces 502-S and 502-G may be collectively referred to herein as traces 502, and traces 504-S and 504-G may be collectively referred to herein as traces 504.)

As shown in FIG. 5, those traces carrying differential signals (e.g., traces 502-S and 504-S) have a smaller surface area (as well as width W) than grounded traces 502-G and 504-G, both of which having width W'. In addition, as further shown in FIG. 5, the pitch between adjacent ones of differential signal carrying traces 504-S and 502-S (e.g., pitch 139) may be greater than pitch 137 between adjacent ones of pads 112. It is understood that although two connections are made to each grounded trace (502-G and 504-G) shown in FIG. 5, any appropriate number of such connections may be made to each grounded trace.

Figure 6:
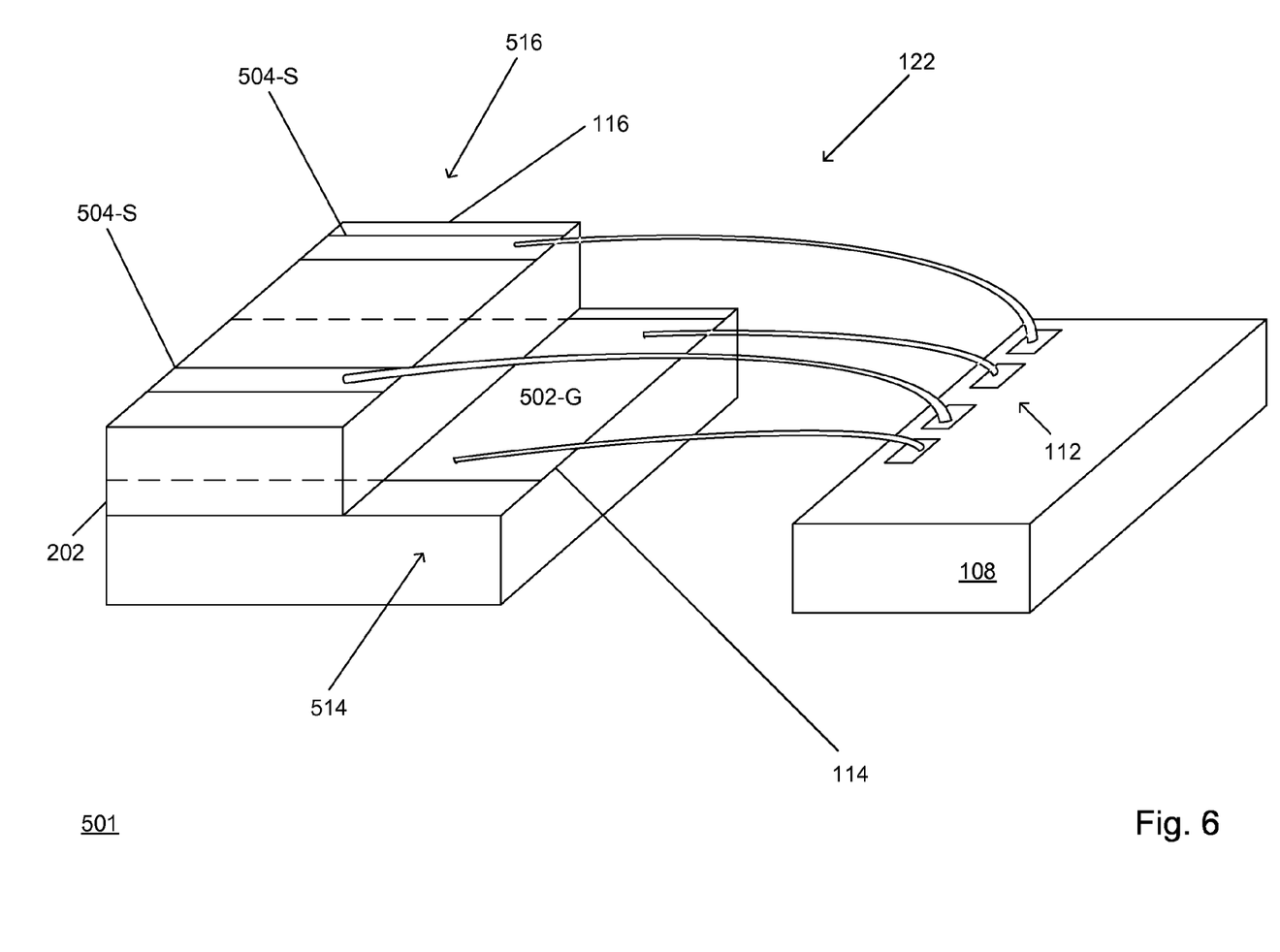
FIG. 6 illustrates a perspective view of a portion of the package shown in FIG. 5.

FIG. 6 illustrates a perspective view of housing portion 501 shown in FIG. 5. As shown in FIG. 6, differential signal carrying traces 504-S overly or overlap grounded trace 502-G. It is further understood that grounded traces 504-G overlap or overly differential signal traces 502-S. Moreover, as in FIG. 1, traces 502 are provided on shelf 114 (extending in plane 514), and traces 504 are provided on shelf 116 (extending in plane 516).

Housing 102' is otherwise similar to housing 102 and has a reduced size, while providing an increased number of connections ASIC 110.

It is understood in the above description that the materials that constitute the insulative layers in housings 102 and 102' may include materials, such as ceramics or other known insulators. In addition, the composition of the conductive portions and wires discussed above may include any suitable metal, alloy, or other suitable known conductor. In one example, the dimensions of selected ones of traces 118 and 120 that carry signals (as opposed to the grounded traces), as well as traces 502-S and 504-S, are such that each has an associated impedance of 100 ohms.

Other embodiments of the invention will be apparent to those skilled in the art from consideration of the specification. For example, although various traces are discussed above as being grounded, it is understood that such traces may have other potentials or voltages other than ground that may be relatively fixed or variable. In addition, the signal carried by traces in housings 102 and 102' may be other than the differential signals discussed above. Namely, any appropriate electrical signal may be carried by such traces. It is intended that the specification and examples be considered as exemplary only, with a true scope and spirit of the invention being indicated by the following claims.

What is claimed is:

1. A package, comprising:
   a housing including a portion configured to receive an integrated circuit, the integrated circuit including a plurality of electrical contacts, adjacent ones of which being separated from one another by a first pitch, the housing having a first surface that extends in a first plane and a second surface that extends in a second plane, the first surface being separated from the plurality of electrical contacts by a first distance and the second surface being separated from the plurality of electrical contacts by a second distance that is greater than the first distance;
   a first plurality of conductors provided on the first surface, adjacent ones of the first plurality of conductors being separated from one another by a second pitch that is greater than the first pitch, each of the first plurality of conductors being configured to be electrically connected to a corresponding one of each of a first group of the plurality of electrical contacts; and
   a second plurality of conductors provided on the second surface, adjacent ones of the second plurality of conductors being separated from one another by a third pitch that is greater than the first pitch, each of the second plurality of conductors being configured to be electrically connected to a corresponding one of each of a second group of the plurality of electrical contacts.

2. A package in accordance with claim 1, wherein pairs of the first plurality of conductors carry first differential electrical signals and pairs of the second plurality of conductors carry second differential electrical signals.

3. A package in accordance with claim 1, wherein the first plurality of conductors is a first plurality of traces and the second plurality of conductors is a second plurality of traces, first and second pairs of the first plurality of traces carry first differential electrical signals and first and second pairs of the second plurality of traces carry second differential electrical signals, a first grounded trace being provided between the first and second pairs of the first plurality of traces and a second grounded trace pad being provided between the first and second pairs of the second plurality of traces.

4. A package in accordance with claim 3, wherein the first grounded trace has a first surface area and each of the first plurality of second bonding pads has a second surface area that is less than the first surface area.

5. A package in accordance with claim 1, wherein each of the first plurality of conductors and each of the second plurality of conductors has a impedance of 100 ohms.

6. A package in accordance with claim 1, wherein the first plurality of conductors is a first plurality of traces and the second plurality of conductors is a second plurality of traces, the housing including an insulative layer that separates the first plurality of traces from the second plurality of traces, at least a portion of each of the first plurality of traces overlapping at least a portion of a corresponding one of each of the second plurality of traces.

7. A package in accordance with claim 1, wherein the first pitch is 100 microns and the second pitch is 200 microns.

8. A package in accordance with claim 1, wherein the second pitch equals the third pitch.

9. A package in accordance with claim 1, wherein the housing further includes first and second pluralities of vias, each of the first plurality of vias extending from a third surface of the housing to a corresponding one of the first plurality of conductors and each of the second plurality of vias extending from the third surface of the housing to a corresponding one of the second plurality of conductors, the package further including:
   a third plurality of conductors, each of which being provided in a corresponding one of the first plurality of vias; and
   a fourth plurality of conductors, each of which being provided in a corresponding one of the second plurality of vias.

10. A package in accordance with claim 9, wherein the housing further includes third and fourth pluralities of vias, the package including:
    a first plurality of grounded traces on the first surface, each of the third plurality of vias extending from the third surface to a corresponding one of the first plurality of grounded traces;
    a second plurality of grounded traces on the second surface, each of the fourth plurality of vias extending from the third surface to a corresponding one of the second plurality of grounded traces;
    a fifth plurality of conductors, each of which being provided in a corresponding one of the plurality of third vias; and
    a sixth plurality of conductors, each of which being provided in a corresponding one of the plurality of fourth vias.

11. An apparatus, comprising:
    an integrated circuit including a plurality of electrical contacts, adjacent ones of which being separated from one another by a first pitch;
    a housing configured to receive the integrated circuit, the housing having a first surface that extends in a first plane and a second surface that extends in a second plane, the first surface being separated from the plurality of electrical contacts by a first distance and the second surface being separated from the plurality of electrical contacts by a second distance that is greater than the first distance;

a first plurality of conductors provided on the first surface, adjacent ones of the first plurality of conductors being separated from one another by a second pitch that is greater than the first pitch, each of the first plurality of conductors being configured to be electrically connected to a corresponding one of each of a first group of the plurality of electrical contacts; and a second plurality of conductors provided on the second surface, adjacent ones of the second plurality of conductors being separated from one another by a third pitch that is greater than the first pitch, each of the second plurality of conductors being configured to be electrically connected to a corresponding one of each of a second group of the plurality of electrical contacts.

12. A package in accordance with claim 11, wherein pairs of the first plurality of conductors carry first differential electrical signals and pairs of the second plurality of conductors carry second differential electrical signals.

13. A package in accordance with claim 11, wherein the first plurality of conductors is a first plurality of traces and the second plurality of conductors is a second plurality of traces, first and second pairs of the first plurality of traces carry first differential electrical signals and first and second pairs of the second plurality of traces carry second differential electrical signals, a first grounded trace being provided between the first and second pairs of the first plurality of traces and a second grounded trace pad being provided between the first and second pairs of the second plurality of traces.

14. A package in accordance with claim 13, wherein the first grounded trace has a first surface and each of the first plurality of second bonding pads has a second surface area that is less than the first surface area.

15. A package in accordance with claim 11, wherein each of the first plurality of conductors and each of the second plurality of conductors has an impedance of 100 ohms.

16. A package in accordance with claim 11, wherein the first plurality of conductors is a first plurality of traces and the second plurality of conductors is a second plurality of traces, the housing including an insulative layer that separates the first plurality of traces from the second plurality of traces, at least a portion of each of the first plurality of traces overlapping at least a portion of a corresponding one of each of the second plurality of traces.

17. A package in accordance with claim 11, wherein the first pitch is 100 microns and the second pitch is 200 microns.

18. A package in accordance with claim 11, wherein the second pitch equals the third pitch.

19. A package in accordance with claim 11, wherein the housing further includes first and second pluralities of vias, each of the first plurality of vias extending from a third surface of the housing to a corresponding one of the first plurality of conductors and each of the second plurality of vias extending from the third surface of the housing to a corresponding one of the second plurality of conductors, the package further including:

a third plurality of conductors, each of which being provided in a corresponding one of the first plurality of vias; and a fourth plurality of conductors, each of which being provided in a corresponding one of the second plurality of vias.

20. A package in accordance with claim 19, wherein the housing further includes third and fourth pluralities of vias, the package including:

a first plurality of grounded traces on the first surface, each of the third plurality of vias extending from the third surface to a corresponding one of the first plurality of grounded traces;

a second plurality of grounded traces on the second surface, each of the fourth plurality of vias extending from the third surface to a corresponding one of the second plurality of grounded traces;

a fifth plurality of conductors, each of which being provided in a corresponding one of the plurality of third vias; and a sixth plurality of conductors, each of which being provided in a corresponding one of the plurality of fourth vias.

21. An apparatus, comprising:

a first integrated circuit chip having a plurality of electrical contacts, adjacent ones of which being separated from one another by a first pitch;

a second integrated circuit chip including an optical modulator circuit that receives first and second pairs of differential inputs, the first integrated circuit chip being electrically connected to the second integrated circuit chip;

a housing configured to receive the first and second integrated circuit chips, the housing having a first surface that extends in a first plane and a second surface that extends in a second plane, the first surface being separated from the plurality of electrical contacts by a first distance and the second surface being separated from the plurality of electrical contacts by a second distance that is greater than the first distance;

first and second conductors provided on the first surface and separated from one another by a second pitch that is greater than the first pitch, the first and second conductors being electrically connected to first and second ones of the plurality of electrical contacts and supplying the first pair of differential inputs;

third and fourth conductors provided on the second surface and separated from one another by the second pitch, the second and third conductors being electrically connected to third and fourth ones of the plurality of electrical contacts and supplying the second pair of differential inputs.

* * * * *